United States Patent
Lin et al.

(10) Patent No.: US 7,684,291 B2
(45) Date of Patent: Mar. 23, 2010

(54) METHOD AND APPARATUS FOR BLANK DETECTION OF AN OPTICAL DISC

(75) Inventors: Yu-Hsuan Lin, Taichung (TW); Yuh Cheng, Chu-Pei (TW); Chih-Ching Chen, Toufen Township, Miaoli County (TW)

(73) Assignee: Mediatek Inc., Hsin-Chu (TW)

( * ) Notice: Subject to any disclaimer, the term of this patent is extended or adjusted under 35 U.S.C. 154(b) by 666 days.

(21) Appl. No.: 11/559,416

(22) Filed: Nov. 14, 2006

(65) Prior Publication Data

US 2007/0280088 A1    Dec. 6, 2007

Related U.S. Application Data

(60) Provisional application No. 60/811,022, filed on Jun. 5, 2006.

(51) Int. Cl.
*G11B 7/00* (2006.01)
(52) U.S. Cl. .................. 369/44.29; 369/124.1
(58) Field of Classification Search .............. 369/44.29, 369/44.34, 44.32, 124.01, 124.05, 124.1, 369/124.15, 44.36, 124.14
See application file for complete search history.

(56) References Cited

U.S. PATENT DOCUMENTS

| | | | |
|---|---|---|---|
| 5,559,785 A | 9/1996 | Honda et al. | |
| 5,623,465 A | 4/1997 | Sasaki et al. | |
| 6,115,334 A | 9/2000 | Tsutsui et al. | |
| 6,154,429 A * | 11/2000 | Grimm | 369/59.18 |
| 6,469,979 B1 | 10/2002 | Joo et al. | |
| 6,728,180 B1 * | 4/2004 | Park | 369/53.11 |
| 6,809,995 B2 | 10/2004 | Kadlec et al. | |
| 6,847,597 B2 | 1/2005 | Kadlec et al. | |
| 6,977,550 B2 | 12/2005 | Ishida et al. | |
| 7,023,766 B2 | 4/2006 | Kadlec et al. | |
| 7,295,073 B2 | 11/2007 | Hsieh et al. | |
| 2004/0172148 A1 | 9/2004 | Horibe | |
| 2005/0243681 A1 | 11/2005 | Yen | |

FOREIGN PATENT DOCUMENTS

| | | |
|---|---|---|
| EP | 0831480 B1 | 8/2001 |
| EP | 1251507 A2 | 10/2002 |

* cited by examiner

*Primary Examiner*—Nabil Z Hindi
(74) *Attorney, Agent, or Firm*—Thomas, Kayden, Horstemeyer & Risley

(57) ABSTRACT

An optical storage device and a blank detection method thereof are disclosed. An RF signal is obtained from an optical disc. A various gain amplifier amplifies the RF signal based on a control signal. An analog to digital converter samples the amplified RF signal to obtain a data signal. An auto gain controller updates the control signal based on amplitude of the data signal. A blank detector detects blankness of the data signal based on a threshold. The threshold is provided by a threshold generator based on the control signal. If the amplitude of the data signal does not exceed the threshold, the blank detector sends a hold signal to suspend update of the control signal.

16 Claims, 8 Drawing Sheets

METHOD AND APPARATUS FOR BLANK DETECTION OF AN OPTICAL DISC

CROSS REFERENCE TO RELATED APPLICATIONS

This application claims the benefit of U.S. Provisional Application No. 60/811,022, filed 2006 Jun. 5.

BACKGROUND OF THE INVENTION

1. Field of the Invention

The invention relates to optical storage devices, and in particular, to blank detection for an optical disc.

2. Description of the Related Art

FIG. 1a shows a conventional optical storage device. Conventionally, data stored in an optical disc is amplified and digitized to a target level before decoding. The various gain amplifier 102, analog to digital converter 104 and auto gain controller 106 form an AGC loop to adjust the gain of the RF signal #RF. An extra data path is formed by a blank detection unit 110 to detect blankness of the RF signal #RF. If amplitude of the RF signal #RF is below a predetermined threshold, the decoder 108 is not enabled to decode data, and the corresponding sector is reported as blank. Otherwise, if the RF signal #RF is not blank, the blank detection unit 110 sends an enable signal #en to the decoder 108, enabling the decoder 108 to decode the data signal #DATA output from analog to digital converter 104.

FIG. 1b is a schematic view showing the definition of blankness. When the amplitude of the RF signal #RF is below the threshold (+th and –th), the corresponding sector where the RF signal #RF is obtained is reported as a blank sector. When the amplitude of RF signal #RF exceeds the threshold, the decoder is enabled to decode the data signal #DATA.

BRIEF SUMMARY OF THE INVENTION

Optical storage devices are provided. An exemplary embodiment of an optical storage device obtains an RF signal from an optical disc. A various gain amplifier amplifies the RF signal based on a control signal. An analog to digital converter samples the amplified RF signal to obtain a data signal. An auto gain controller updates the control signal based on the amplitude of the data signal. A blank detector detects the blankness of the data signal based on a threshold. The threshold is provided by a threshold generator based on the control signal. If the amplitude of the data signal does not exceed the threshold, the blank detector sends a hold signal to suspend update of the control signal.

The optical storage device may further comprise a decoder. If the amplitude of the data signal exceeds the threshold, the blank detector generates an enable signal to enable the decoder, and the decoder is enabled to decode the data signal.

The threshold generator may be a lookup table for converting the control signal into the threshold with a linear relationship. Alternatively, the threshold generator may be a converter comprising a controller, a multiplier and an adder. The controller receives the control signal to generate a slope value and an offset value. The multiplier multiplies the control signal with the slope value, and the adder adds the output of multiplier with the offset value to generate the threshold when the amplitude of the control signal is in a first range, the controller generates the slope value of a first slope value, and the offset value of a first offset value. When the amplitude of the control signal is in a second range, the controller generates the slope value of a second slope value, and the offset value of a second offset value.

The blank detector comprises a high pass filter, receiving the data signal to filter out low frequency components; a hysteresis, coupled to the high pass filter, slicing the data signal into a square wave signal based on the threshold, and a counter, coupled to the hysteresis, counting the duty cycle of the square wave signal to determine blankness of the RF signal. If the counter detects non-zero square wave signal, the counter generates an enable signal to enable the decoder, and the decoder is enabled to decode the data signal.

The invention further provides a blank detection method based on the described optical storage device. A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
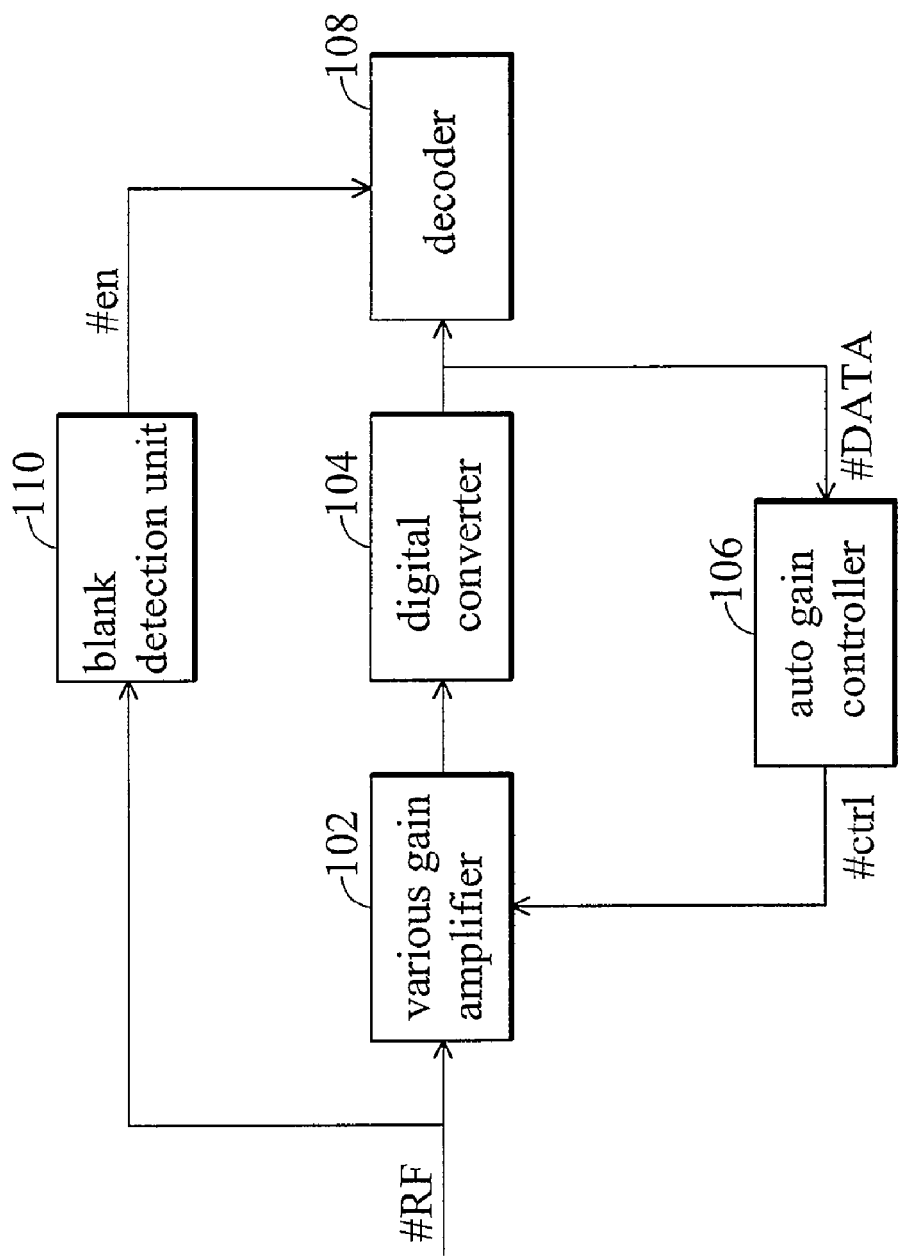
FIG. 1a shows a conventional optical storage device.
Figure 1B:
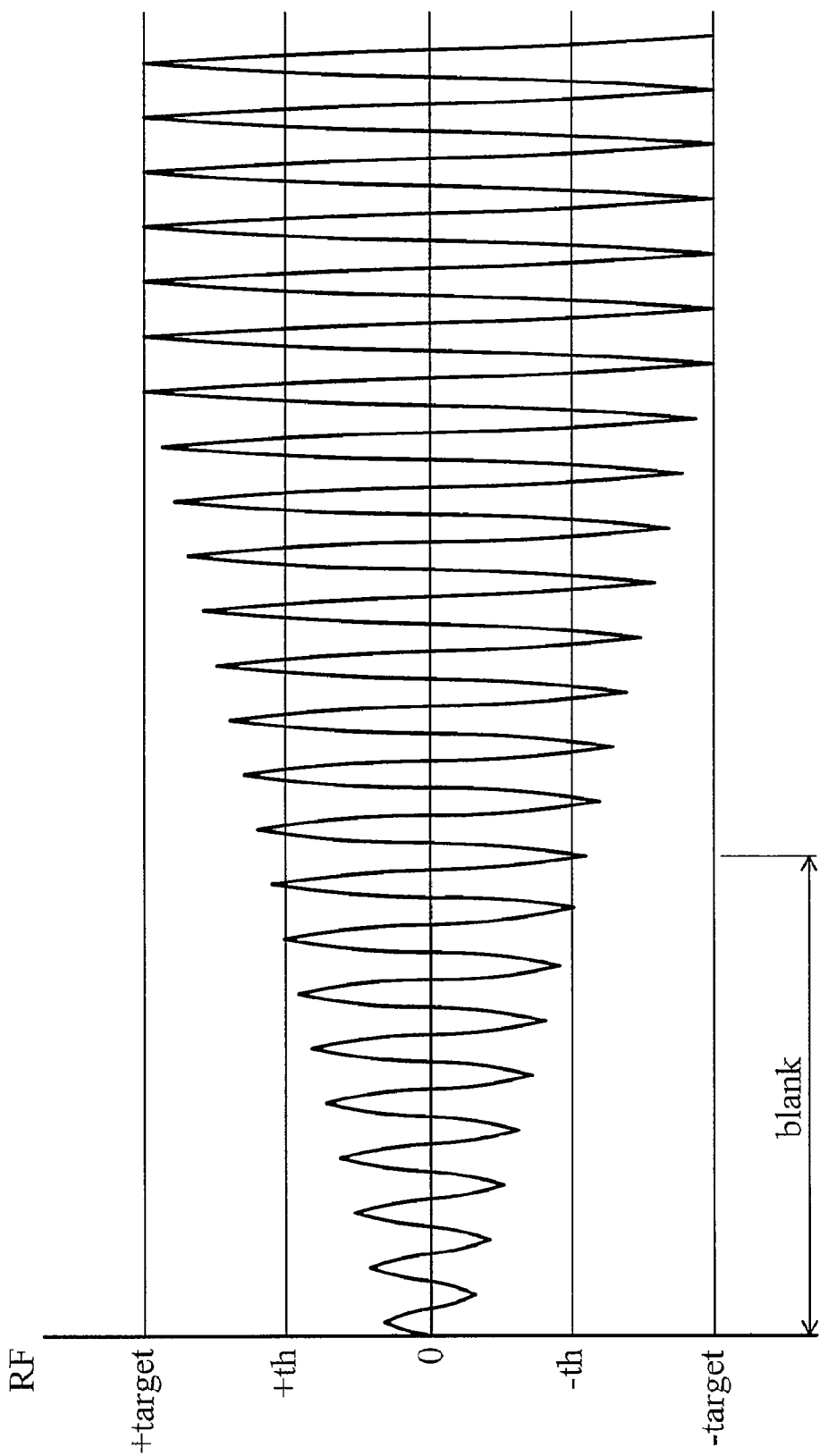
FIG. 1b is a schematic view showing the definition of blankness.
Figure 2:
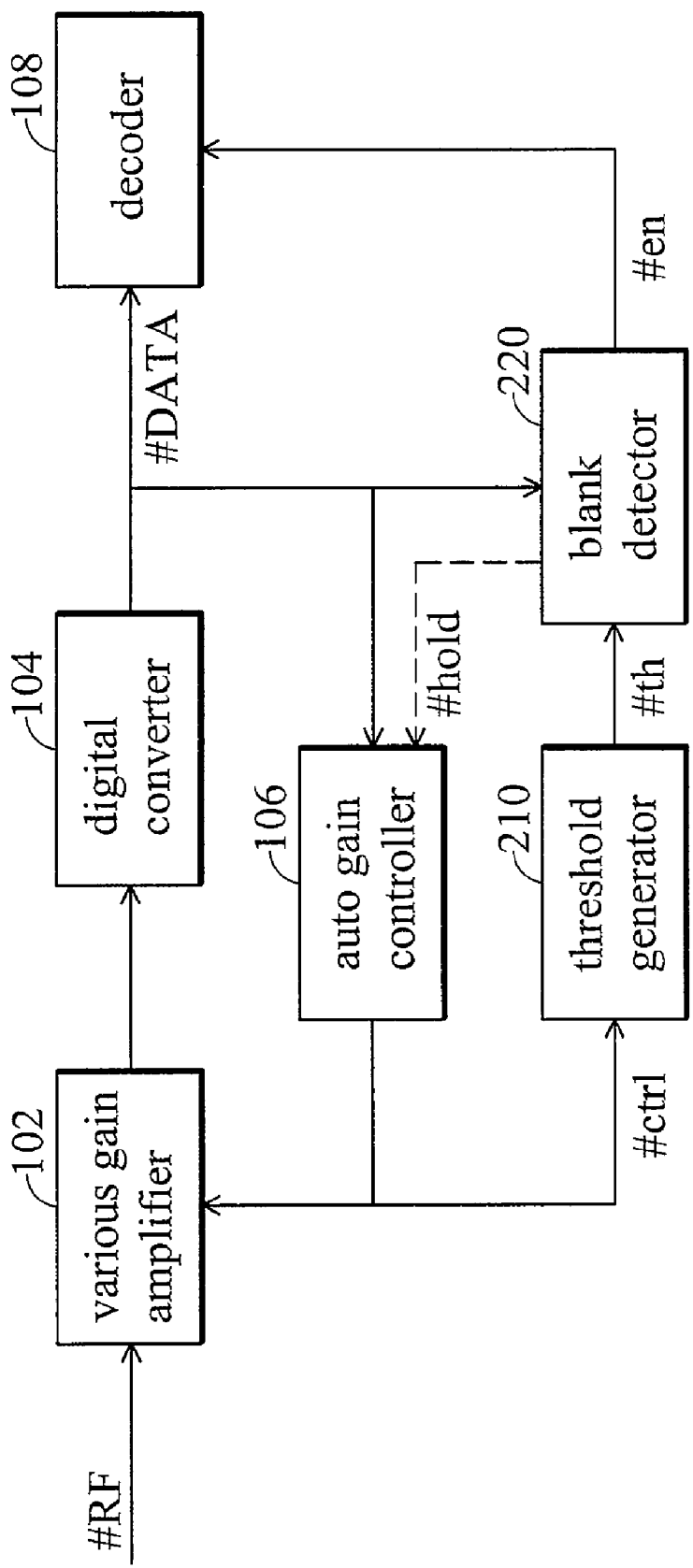
FIG. 2 shows an embodiment of an optical storage device.

FIG. 2 shows an embodiment of an optical storage device. In the embodiment, a different structure is provided. A blank detector 220 uses data signal #DATA output from the analog to digital converter for blank detection, reducing the cost of implementing the circuit path of the blank detection unit 110 in FIG. 1. The blank detector 220 is implemented as a digital circuit, the cost of which is lower than analog circuits. In FIG. 1, the data signal #DATA output from the analog to digital converter is sent to auto gain controller 106, and the auto gain controller 106 generates a control signal #ctrl to the various gain amplifier 102 to adjust the gain value for amplifying the RF signal #RF, thus an AGC loop is formed thereby to gradually approximate the amplitude of the data signal #DATA to a target level. Since amplitude of the data signal #DATA varies, the blank detector 220 may obtain a false blank detection result. To ensure more accurate detection, the threshold generator 210 provides a dynamic threshold #th proportional to the control signal #ctrl. Thus, when the data signal #DATA is amplified, the threshold #th is amplified identically, enabling the blank detector 220 to detect blankness regardless of whether the various gain amplifier 102 amplifies the RF signal #RF.

If blank for a period of time, the AGC loop may gradually amplify the RF signal #RF to reach the target level, causing unwanted loop divergence. The blank detector 220 may provide an optional function for solving this problem. If the amplitude of the data signal #DATA does not exceed the threshold #th, which means the RF signal #RF is blank, the blank detector 220 sends a hold signal #hold to the auto gain controller 106 to suspend update of the control signal #ctrl. Thus, the gain value of a blank RF signal #RF is kept constant. Simultaneously, blank detection continues with the threshold #th calculated from the control signal #ctrl while the auto gain controller 106 is suspended. When the data signal #DATA is determined to be non-blank, the auto gain controller 106 is again activated to enable the AGC loop.

Figure 3A:
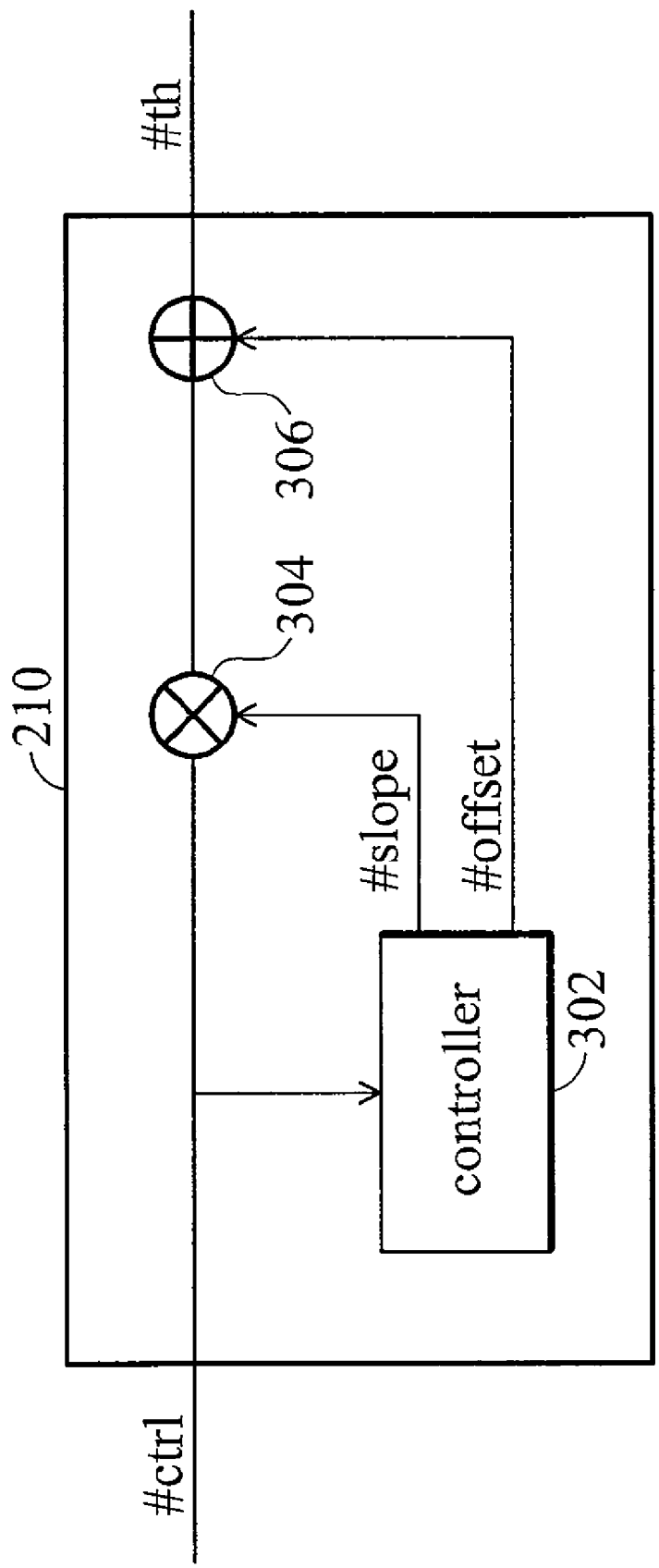
FIG. 3a shows an embodiment of the threshold generator 210 according to FIG. 2.
Figure 3B:
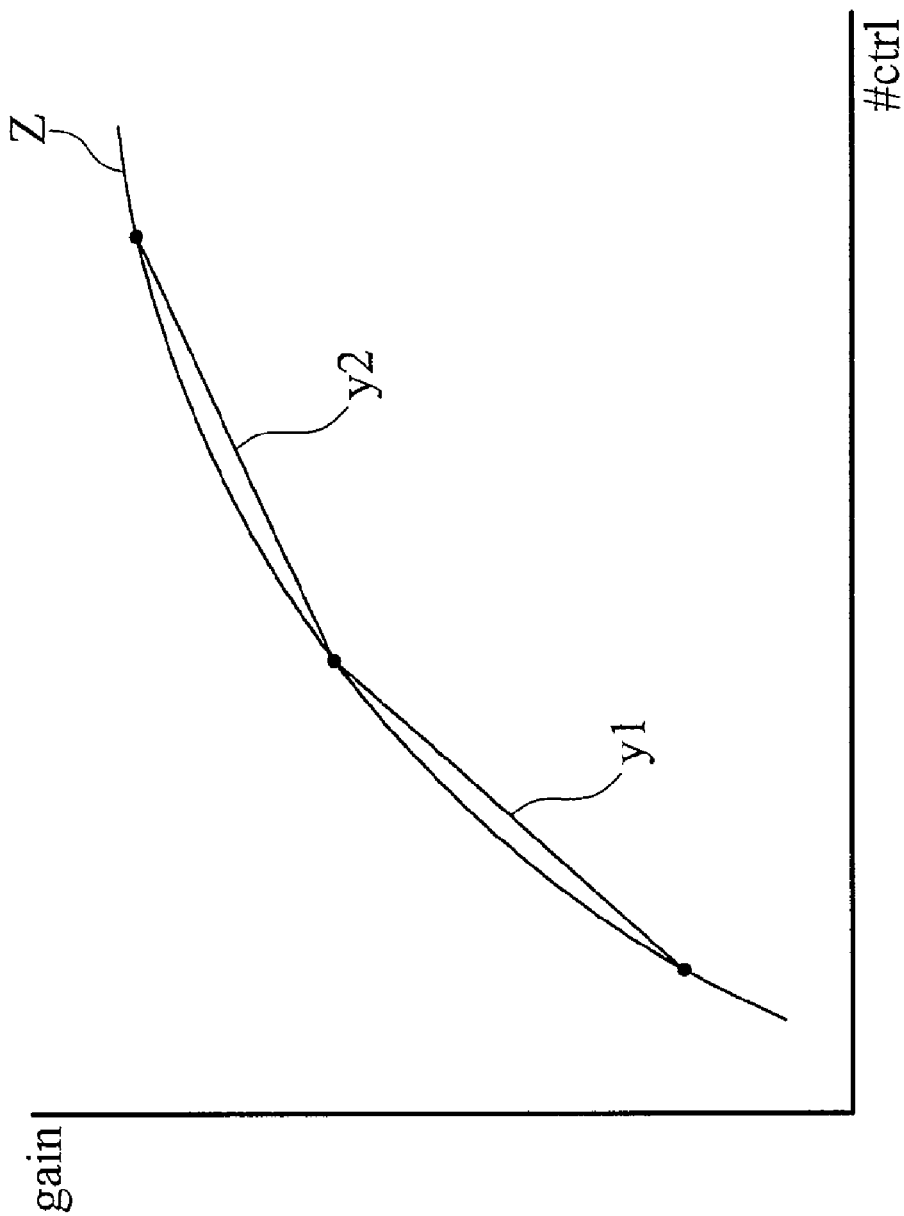
FIG. 3b is a transition chart of gain versus control signal #ctrl.

FIG. 3a shows an embodiment of the threshold generator 210 according to FIG. 2, and FIG. 3b is a transition chart of gain versus the control signal #ctrl. The threshold #th is proportional to the control signal #ctrl as well as the gain value in the various gain amplifier 102. To simplify the implementation, the threshold generator 210 may be a digital circuit converting the control signal #ctrl with an approximated linear relationship. In FIG. 3b, the curve z indicates gain value generated by the various gain amplifier 102 corresponding to the control signal #ctrl. The lines y1 and y2 are provided by the threshold generator 210 to approximate the curve z, and the threshold #th is generated accordingly. The threshold generator 210 comprises an adder 306, a controller 302 and a multiplier 304. The lines $y_1$ or $y_2$ can be denoted as a linear function:

$$y_n = a_n x + b_n$$

Where n is an integer, $a_n$ is the slope and $b_n$ is the offset.

In FIG. 3a, the adder 306 receives the control signal #ctrl to generate a slope value #slope and a offset value #offset. The values of the slope value #slope and offset value #offset vary with the control signal #ctrl. The controller 302 then multiplies the control signal #ctrl with the slope value #slope, and the multiplier 304 adds the output of multiplier 304 with the offset value #offset to generate the threshold #th. The value of the control signal #ctrl can be categorized into several ranges, each corresponding to a line of different slope and offset. For example, FIG. 3b is a case of n equal to 2, thus two lines are presented to approximate the curve z. When the amplitude of the control signal #ctrl is in a first range, the controller 302 generates the slope value #slope $a_1$ and offset value #offset $b_1$. When the amplitude of the control signal #ctrl is in a second range, the controller 302 generates the slope value #slope $a_2$ and the offset value #offset $b_2$. The value n is not limited to be 2, and can be increased to provide more accurate approximation. Alternatively, the threshold generator 210 can be a digital lookup table directly mapping the control signal #ctrl to the threshold #th. The characteristic curve z is often obtained by conventional calibration processes, thus the threshold generator 210 can be configured at the calibration stage as well.

Figure 4:
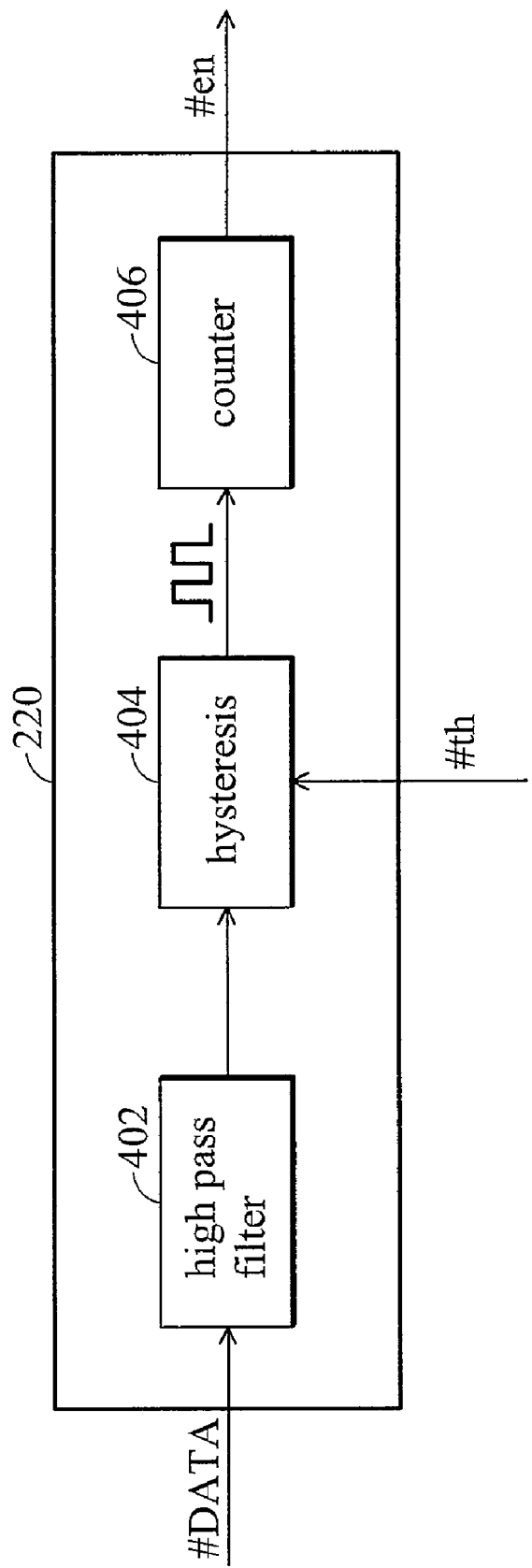
FIG. 4 shows an embodiment of a blank detector 220 according to FIG. 2.

FIG. 4 shows an embodiment of a blank detector 220 according to FIG. 2. The blank detector 220 comprises three digital components, a high pass filter 402, a hysteresis 404 and a counter 406. The high pass filter 402 receives the data signal #DATA to filter out low frequency components. The hysteresis 404 is coupled to the high pass filter 402, slicing the data signal #DATA into a square wave signal to represent value 0 or 1 with varying duty cycles. The counter 406 counts the duty cycle of the square wave signal to determine blankness of the RF signal #RF. The threshold #th can be sent to the hysteresis 404 to determine sensitivity for triggering a square wave signal from the data signal #DATA. Alternatively, the threshold #th can be sent to the counter 406 to decide a counting number of the square wave signal. For example, if the threshold #th controls sensitivity of the hysteresis 404, the filtered data signal #DATA from high pass filter 402 will not generate a square wave if it's magnitude is lower than a value corresponding to the threshold #th, and the counter 406 determines the RF signal #RF as blank since no (or few) square wave is counted. When the counter 406 detects non-zero square wave signal, an enable signal #en is sent to enable the decoder 108, and the decoder 108 is enabled to decode the data signal #DATA.

Figure 5:
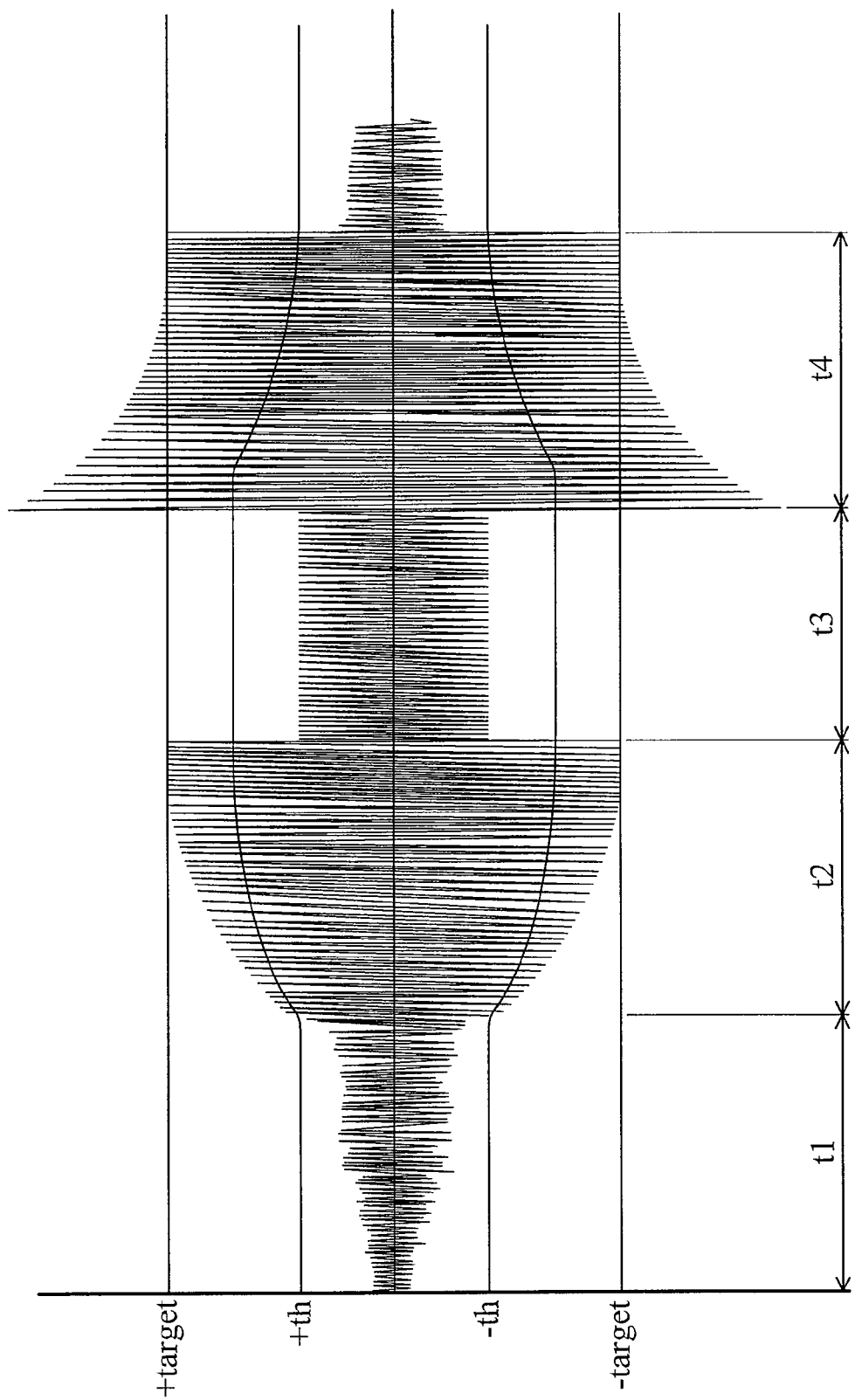
FIG. 5 shows an example of waveform transition according to the embodiment.

FIG. 5 shows an example of waveform transition according to the embodiment. In period t1, the amplitude of data signal #DATA does not exceed the threshold #th, so the RF signal #RF is reported as blank, and the threshold #th remain constant because the auto gain controller 106 is suspended by the hold signal #hold. In period t2, the amplitude of data signal #DATA exceeds the threshold #th, so the AGC loop is activated to gradually amplify the data signal #DATA to the target value (+-target). Simultaneously, the threshold #th is increased in proportion to the amplification of the data signal #DATA. In period t3, the amplitude of data signal #DATA falls below the threshold #th, which means another blank section is read. Note that the threshold #th in period t3 is higher than that in period t1. If the threshold #th is not dynamically adjusted, the data signal #DATA in period t3 may be deemed non-blank because its amplitude is higher than the threshold #th in period t1. Since blank is detected in period t3, the AGC loop is suspended again, so the threshold #th remains constant as well as the gain in the various gain amplifier 102. In period t4, a data signal #DATA of exceedingly high amplitude may be received, and the AGC loop is activated to reduce its amplitude to the target level. Simultaneously, the threshold #th is reduced proportionally. This embodiment shows a dynamically adjusted threshold #th that avoids false blank detection.

Figure 6:
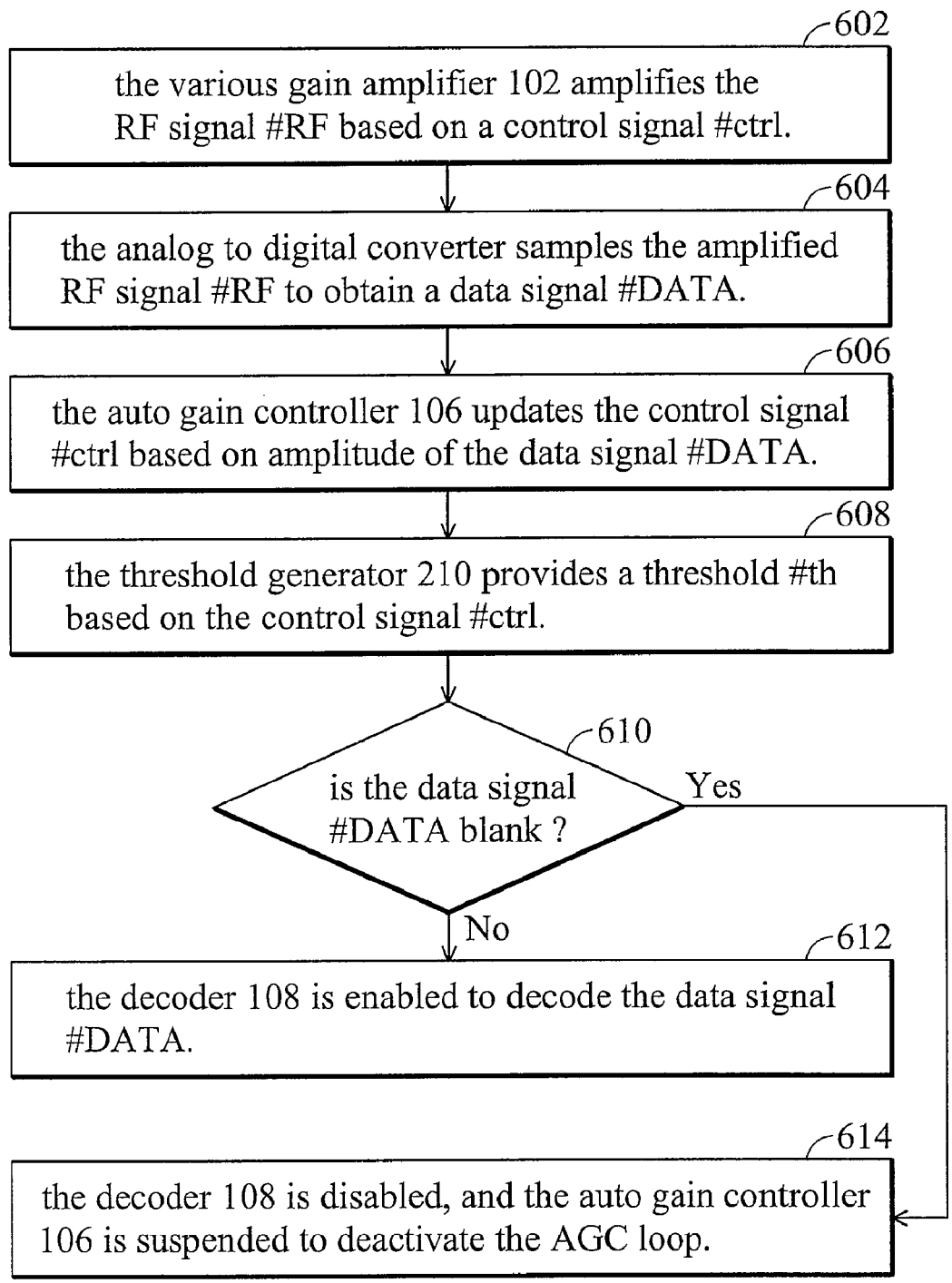
FIG. 6 is a flowchart of the blankness detection method.

FIG. 6 is a flowchart of the blankness detection method. In step 602, the various gain amplifier 102 amplifies the RF signal #RF based on a control signal #ctrl. In step 604, the analog to digital converter samples the amplified RF signal #RF to obtain a data signal #DATA. In step 606, the auto gain controller 106 updates the control signal #ctrl based on amplitude of the data signal #DATA. In step 608, the threshold generator 210 provides a threshold #th based on the control signal #ctrl. In step 610, the blank detector 220 detects blankness of the data signal #DATA based on the threshold #th. In step 612, if the data signal #DATA is not blank, the decoder 108 is enabled to decode the data signal #DATA. In step 614, if blankness is detected, the blank detector 220 disables the decoder 108, and suspends the auto gain controller 106 to deactivate the AGC loop.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An optical storage device, obtaining an RF signal from an optical disc, comprising:
   a various gain amplifier, amplifying the RF signal based on a control signal;
   an analog to digital converter, coupled to the various gain amplifier, sampling the amplified RF signal to obtain a data signal;

an auto gain controller, coupled to the output of analog to digital converter, updating the control signal based on amplitude of the data signal;

a blank detector, coupled to the output of analog to digital converter, detecting blankness of the data signal based on a threshold; and a threshold generator, coupled to the auto gain controller and blank detector, providing the threshold based on the control signal.

2. The optical storage device as claimed in claim 1, wherein if the amplitude of the data signal does not exceed the threshold, the blank detector sends a hold signal to suspend update of the control signal.

3. The optical storage device as claimed in claim 1, further comprising a decoder, coupled to the analog to digital converter and blank detector, wherein if the amplitude of the data signal exceeds the threshold, the blank detector generates an enable signal to enable the decoder, and the decoder is enabled to decode the data signal.

4. The optical storage device as claimed in claim 1, wherein the threshold generator comprises a lookup table for converting the control signal into the threshold with a linear relationship.

5. The optical storage device as claimed in claim 1, wherein the threshold generator comprises:

a controller, receiving the control signal to generate a slope value and an offset value;

a multiplier, coupled to the controller, multiplying the control signal with the slope value; and an adder, coupled to the output of multiplier and controller, adding the output of multiplier with the offset value to generate the threshold.

6. The optical storage device as claimed in claim 5, wherein:

when the amplitude of the control signal is in a first range, the controller generates the slope value of a first slope value, and the offset value of a first offset value; and when the amplitude of the control signal is in a second range, the controller generates the slope value of a second slope value, and the offset value of a second offset value.

7. The optical storage device as claimed in claim 1, wherein the blank detector comprises:

a high pass filter, receiving the data signal to filter out low frequency components;

a hysteresis, coupled to the high pass filter, slicing the data signal into a square wave signal based on the threshold; and a counter, coupled to the hysteresis, counting the duty cycle of the square wave signal to determine blankness of the RF signal.

8. The optical storage device as claimed in claim 7, further comprising a decoder, coupled to the analog to digital converter and blank detector, wherein if the counter detects non-zero square wave signal, the counter generates an enable signal to enable the decoder, and the decoder is enabled to decode the data signal.

9. A blank detection method for an optical storage device, comprising:

obtaining an RF signal from an optical disc;

amplifying the RF signal based on a control signal;

sampling the amplified RF signal to obtain a data signal;

updating the control signal based on amplitude of the data signal;

providing a threshold based on the control signal; and detecting blankness of the data signal based on the threshold.

10. The blank detection method as claimed in claim 9, further comprising, if the amplitude of the data signal does not exceed the threshold, suspending update of the control signal.

11. The blank detection method as claimed in claim 9, further comprising, if the amplitude of the data signal exceeds the threshold, decoding the data signal by a decoder.

12. The blank detection method as claimed in claim 9, wherein the provision of the threshold comprises looking up a lookup table for converting the control signal into the threshold with a linear relationship.

13. The blank detection method as claimed in claim 9, wherein the provision of the threshold comprises:

generate a slope value and a offset value based on the control signal;

multiplying the control signal with the slope value; and adding the multiplication with the offset value to generate the threshold.

14. The blank detection method as claimed in claim 13, wherein the generation of the slope value and the offset value comprises:

when the amplitude of the control signal is in a first range, generating the slope value of a first slope value, and the offset value of a first offset value; and when the amplitude of the control signal is in a second range, generating the slope value of a second slope value, and the offset value of a second offset value.

15. The blank detection method as claimed in claim 9, wherein the blank detection comprises:

receiving the data signal to filter out low frequency components;

slicing the data signal into a square wave signal based on the threshold; and counting duty cycle of the square wave signal to determine blankness of the RF signal.

16. The blank detection method as claimed in claim 15, further comprising, if the square wave signal is not zero, enabling a decoder to decode the data signal.

* * * * *